United States Patent
Vdolek

(10) Patent No.: US 8,253,784 B2
(45) Date of Patent: Aug. 28, 2012

(54) IMAGE CAPTURING DEVICE ASSEMBLY FOR USE WITH TEST PROBE

(75) Inventor: Alexander D. Vdolek, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 946 days.

(21) Appl. No.: 12/270,494

(22) Filed: Nov. 13, 2008

(65) Prior Publication Data

US 2010/0118135 A1    May 13, 2010

(51) Int. Cl.
*A61B 1/04*    (2006.01)

(52) U.S. Cl. ............................. 348/73; 348/86; 348/87

(58) Field of Classification Search .................. 348/73, 348/86, 87; 324/761, 238, 757, 758; 359/380; 435/5; 2/237; 356/73
See application file for complete search history.

(56) References Cited

U.S. PATENT DOCUMENTS

| | | | |
|---|---|---|---|
| 3,889,053 A | 6/1975 | Lloyd et al. | |
| 4,820,975 A | 4/1989 | Diggle | |
| 5,438,265 A | 8/1995 | Eslambolchi et al. | |
| 5,808,464 A | 9/1998 | Natori et al. | |
| 6,356,093 B2 | 3/2002 | Nishikawa et al. | |
| 6,710,798 B1 | 3/2004 | Hershel et al. | |
| 6,847,394 B1 | 1/2005 | Hansen et al. | |
| 6,961,081 B2 | 11/2005 | Chen | |
| 7,015,711 B2 | 3/2006 | Rothaug et al. | |
| 7,053,642 B2 | 5/2006 | Russell | |
| 7,075,322 B2 | 7/2006 | Huang | |
| 2002/0018609 A1 | 2/2002 | Schumann | |
| 2003/0103137 A1 | 6/2003 | Espertshuber et al. | |
| 2003/0186222 A1* | 10/2003 | Paul, III | 435/5 |
| 2004/0174529 A1 | 9/2004 | Maznev et al. | |
| 2005/0223810 A1 | 10/2005 | Zhang et al. | |
| 2006/0092505 A1* | 5/2006 | Abnet et al. | 359/380 |
| 2008/0212078 A1* | 9/2008 | Teich et al. | 356/73 |
| 2008/0290885 A1* | 11/2008 | Matsunami | 324/758 |
| 2009/0021276 A1* | 1/2009 | Boss et al. | 324/761 |
| 2009/0058445 A1* | 3/2009 | Leon | 324/757 |
| 2009/0126079 A1* | 5/2009 | Kato | 2/237 |
| 2010/0097057 A1* | 4/2010 | Karpen | 324/238 |

\* cited by examiner

*Primary Examiner* — Le H Luu

(74) *Attorney, Agent, or Firm* — Ingrassia Fisher & Lorenz, P.C.

(57) ABSTRACT

An image capturing device assembly for use with a test probe and a testing system. The image capturing device assembly including an image capturing device module configured for coupling to an external surface of the test probe and having an image capturing device housed within. The image capturing device is configured to generate a digital output video signal or the analog output video signal of a testing site. A digital monitor is coupled to the image capturing device via a wired or wireless link and configured to receive the digital output signal and generate a display of the testing site on the display monitor.

20 Claims, 4 Drawing Sheets

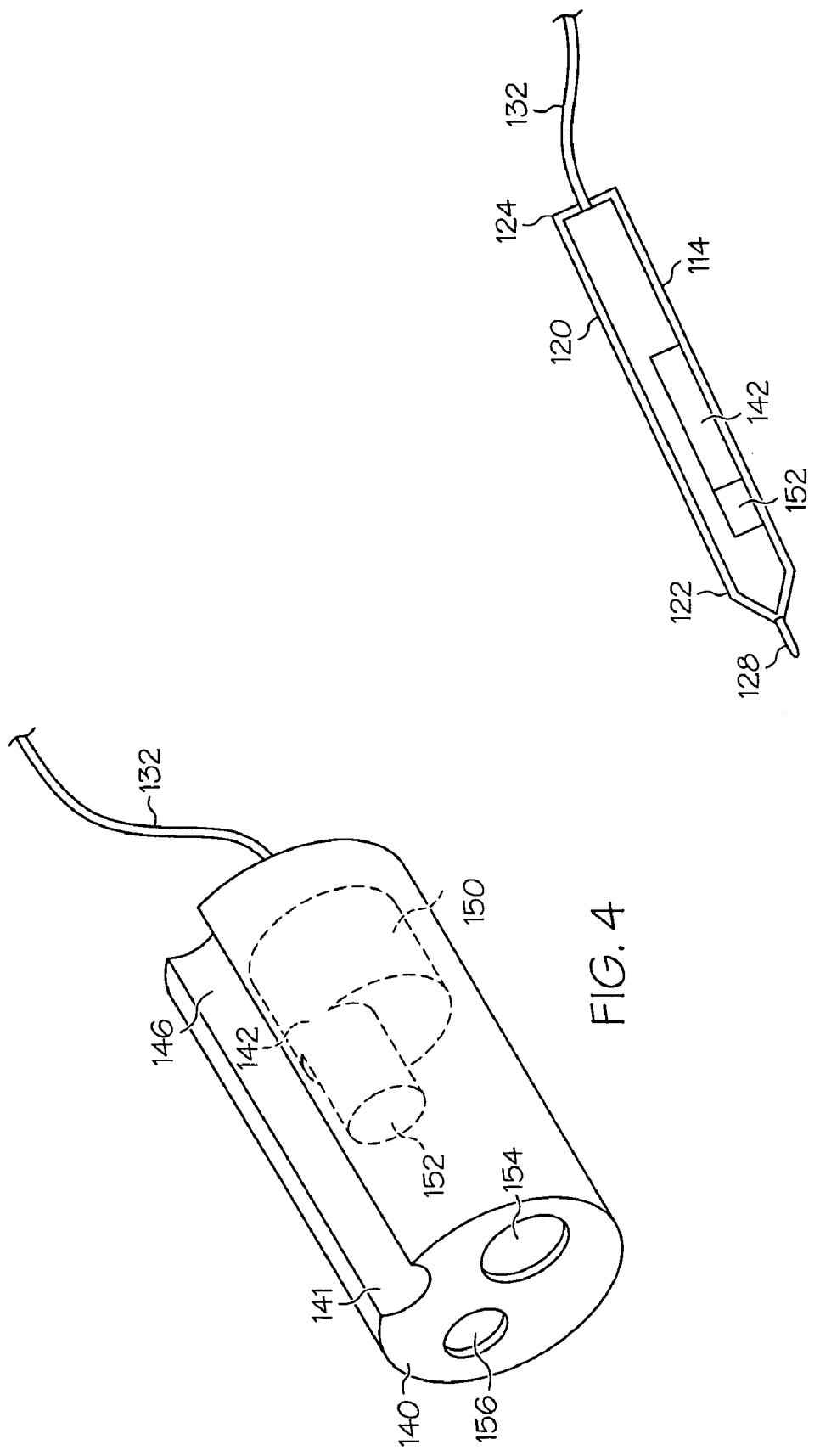

IMAGE CAPTURING DEVICE ASSEMBLY FOR USE WITH TEST PROBE

TECHNICAL FIELD

The present invention relates to test probes and, more particularly, an image capturing device assembly for use with a test probe.

BACKGROUND

An oscilloscope is an electronic testing device that allows signal voltages that are detected via the use of a probe, also referred to as an oscilloscope test probe, to be viewed as a two-dimensional graph. In most instances the signal voltages are viewed as electrical potential differences plotted as a function of time or other voltage. Oscilloscopes are often used when it is desired to test or troubleshoot modern printed circuit board assemblies. Testing of modern circuit boards with an oscilloscope probe or test probe may be challenging due to the small size of the circuit board components, solder pads, via sizes, and limited visibility of the board by the operator due to operator positioning relative to the test probe.

In a typical test situation, an oscilloscope device, including a test probe is used for testing and troubleshooting electronic assemblies. During testing or troubleshooting, the oscilloscope probe, or test probe, is positioned to make electrical contact with the component lead or printed circuit trace of interest. The probe is connected to an oscilloscope device, including a display monitor, via a cable thereby enabling observation of a wave shape, amplitude, frequency, or distortion of an electrical signal present at the monitored point and/or timing between two or more electrical signals. The oscilloscope test probe in conjunction with the display monitor enables the operator to verify the electrical functionality of the board being tested.

With high density printed circuit boards, the operator must continually monitor the probe location relative to the circuit being tested, to verify that the scope probe maintains contact with the circuit of interest. The operator must also maintain a view of the oscilloscope display monitor to interpret test results. This type of continual monitoring of both system components may require the operator to continually change his field of view, and often physical position, relative to the test probe and/or display monitor, to maintain proper positioning of the test probe at the test point.

Accordingly, there is a need for a test probe that enables the operator to simultaneously view the test point and the display monitor where the test information is viewable. In addition, it is desirable to provide for a device that can be used in conjunction with test probes that are currently on the market to minimize the need for additional equipment outlay, cost and overall system complexity.

BRIEF SUMMARY

The present invention provides an image capturing device assembly for use with a test probe.

In one embodiment, and by way of example only, there is provided an image capturing device assembly for use with a test probe including an image capturing device module configured for coupling to a surface of the test probe. The image capturing device module includes an image capturing device configured to generate an output video signal. The assembly further including a display monitor coupled to the image capturing device and configured to receive the output video signal and generate a display.

In another exemplary embodiment, and by way of example only, there is provided a test probe and image capturing device assembly including a test probe having a main body, including a first end and a second end and defining a passage extending between the first end and the second end. The test probe further includes a probe tip defined at the second end. The assembly further including an image capturing device assembly configured for coupling to an external surface of the test probe. The image capturing device assembly including a body portion and an image capturing device coupled to the body portion and a display monitor coupled to the image capturing device. The image capturing device is configured to generate an output video signal. The display monitor is configured to receive the output video signal and generate a display.

In yet another exemplary embodiment, and by way of example only, there is provided a system for testing circuit board assemblies. The system includes an electronic testing device including a test probe, processing means and a display monitor configured to provide viewing of a plurality of signal voltages received by the test probe on the display monitor. The system further includes an image capturing device assembly configured for coupling to an external surface of the test probe and generating at least one of a digital output video signal or an analog output video signal viewable on a linked display monitor. The test probe includes a main body having a first end and a second end and defining a passage extending between the first end and the second end. The test probe further including a test point at the second end for contacting a test site. The image capturing device assembly includes body portion and an image capturing device coupled to the body portion. The image capturing device is configured to generate the digital output video signal or the analog output video signal. The display monitor is configured to receive the digital output video signal or the analog output video signal.

Other independent features and advantages of an image capturing device assembly for use with a test probe and a test probe including the image capturing device will become apparent from the following detailed description, taken in conjunction with the accompanying drawings which illustrate, by way of example, the principles of the invention.

BRIEF DESCRIPTION OF THE DRAWINGS

The present invention will hereinafter be described in conjunction with the following drawing figure, wherein:

FIG. 4 is an enlarged three-dimensional view of an image capturing device assembly according to an embodiment;

FIG. 5 is an enlarged cross-sectional view of a test probe and an image capturing device assembly according to an embodiment;

DETAILED DESCRIPTION

Before proceeding with the description, it is to be appreciated that the following detailed description is merely exemplary in nature and is not intended to limit the invention or the application and uses of the invention. Furthermore, there is no intention to be bound by any theory presented in the preceding background or the following detailed description.

The embodiment disclosed herein is described in sufficient detail to enable those skilled in the art to practice the invention, and it is to be understood that other embodiments may be utilized and that logical mechanical and electrical changes may be made without departing from the scope of the present invention. Furthermore, it will be understood by one of skilled in the art that although the specific embodiment illustrated below is directed at the probe component of an oscilloscope, for purposes of explanation, the image capturing device assembly design may be used in conjunction with various other electronic devices that incorporate probes, such as multimeters, spectrum analyzers, logic analyzers, or the like. The following detailed description is, therefore, not to be taken in a limiting sense.

Figure 1:
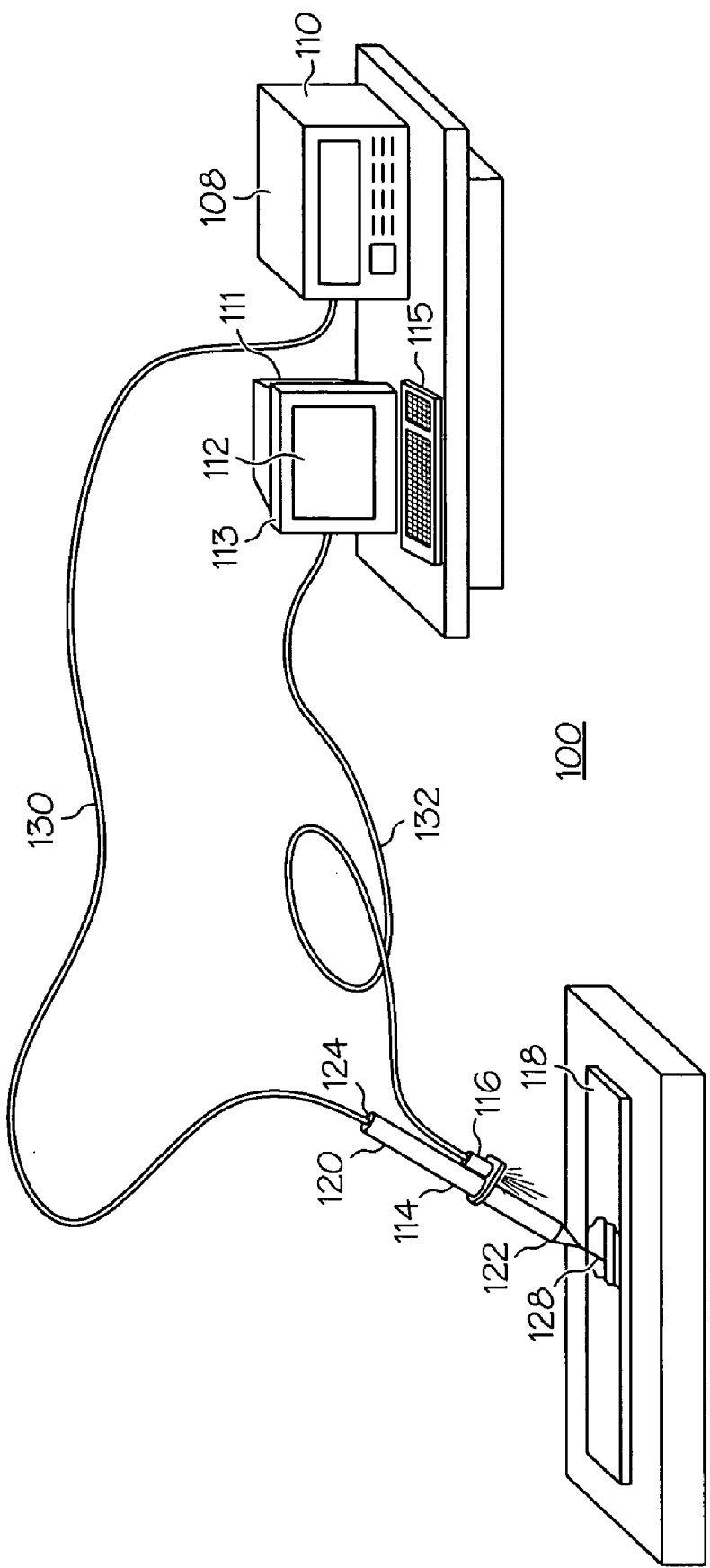
FIG. 1 is a three-dimensional schematic view of a testing system including a test probe, image capturing device assembly and associated display monitors, according to an embodiment.

Turning now to FIG. 1, illustrated in a three-dimensional view is a portion of an exemplary testing system 100, according to an embodiment. In this particular embodiment, the testing system 100 is an oscilloscope test system commonly used for testing circuit board assemblies. The testing system 100 includes an oscilloscope 108 including a test probe 114 and an associated display monitor 110. The testing system 100 further includes a computer 111, such as a personal computer or the like, including a display monitor 112, a processor board with memory 113, and a user input 115, such as a keyboard of the like. The computer 111 may further include a software application that drives the imaging operations for an image capturing device assembly 116 included as part of the testing system 100. The computer 111 functions in cooperation with a test probe 114 and the image capturing device assembly 116 to enable testing of a circuit board 118, such as a printed circuit board assembly. In an alternate embodiment, the system may simply include a video monitor for viewing without the need for the computer 111.

The test probe 114 is preferably an industry standard oscilloscope probe and includes a substantially cylindrically main body 120 that has first and second ends 122, 124 and a passage extending between the first and second ends 122, 124. The test probe first end 122 may include a tip 128 for contacting a test point. A wired link 130, such as a flexible cable, couples the test probe 114 to the oscilloscope 108 and the associated display monitor 110 and may supply power to the test probe 114. The image capturing device assembly 116, in this particular embodiment includes a wired link 132, such as a flexible cable, coupling the image capturing device assembly 116 to the computer 111 and the associated display monitor 112. During operation of the testing system 100, the image capturing device assembly 116 delivers an enlarged image of the position of the test probe tip 128 relative to the circuit board 118 viewable on the display monitor 112. During use, the operator is able to grasp the test probe 114 about the main body 120 and position the test probe tip 128 relative to the circuit board 118 without changing his field of vision from viewing information on the display monitor 112 and the oscilloscope display monitor 110.

Figure 3:
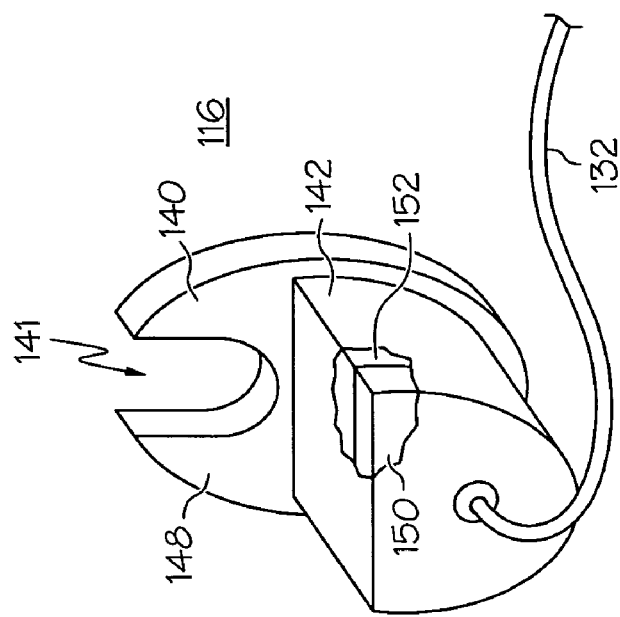
FIG. 3 is an enlarged three-dimensional view of an image capturing device assembly according to an embodiment.
Figure 2:
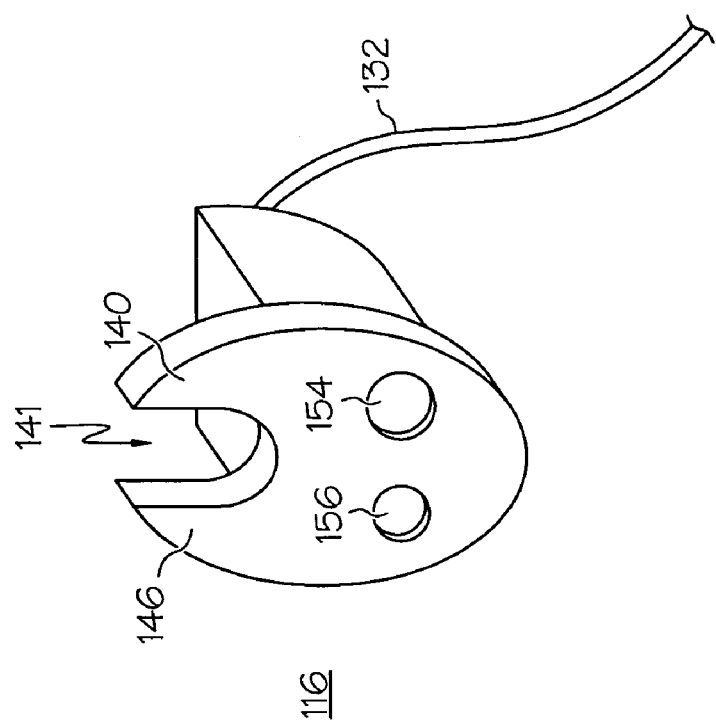
FIG. 2 is an enlarged three-dimensional view of an image capturing device assembly according to an embodiment.

Referring now to FIGS. 2 and 3, illustrated in enlarged three-dimensional view is the image capturing device assembly 116 of FIG. 1. In a preferred embodiment, the image capturing device assembly 116 includes a body portion 140 having an image capturing device module 142 mounted thereto. The body portion 140 includes an attachment means 141 that provides for coupling of the body portion 140 to a test probe, such as test probe 114 of FIG. 1. In the illustrated embodiment, the attachment means 141 is configured as a mechanical clip-on type device defined in the body portion 140 such as illustrated in FIGS. 2 and 3 and capable of detachably engaging the test probe. More specifically, the body portion 140 is configured to include a cut-out 146 and provide a close-tolerance fit about a test probe, such as about the main body 120 of the test probe 114 of FIG. 1. The image capturing device module 142 is mounted on a first side 148 of the body portion 140 and includes an image capturing device 150, such as a CCD (Charge Coupled Device) imaging camera housed therein and illustrated by a cut-away portion in FIG. 3. In this preferred embodiment, the image capturing device 150 receives a supply voltage as input and generates a video signal as output. More specifically, the image capturing device 150 receives a supply voltage from the computer 111 (FIG. 1) or video monitor via the wired link 132 and generates a digital or analog video signal output viewable on the display monitor 112 via the wired link 132. The image capturing device 150 preferably operates using visible light, or light having wavelength in a range of 400-700 nm that is directed onto the test site. Accordingly, a light source 152 capable of emitting a visible light may optionally be housed within the image capturing device module 142. The light source 152 operates to provide uniform illumination of the circuit board 118 being tested, so that a board area with poor lighting may be clearly viewed. In an alternative embodiment, the image capturing device 150 may also operate using ultraviolet light, or light having a wavelength in a range of 200-400 nm when used in combination with specifically ultraviolet identifiable test sites planned during manufacture of a circuit board.

As best illustrated in FIG. 2, the body portion 140 includes an imaging lens 154 embedded of formed therein and in alignment with an input of the image capturing device 150. In an embodiment where a light source 152 is included as a part of the image capturing device assembly 116, an opening 156 is formed in the body portion 140 in alignment with an output of the light source 152 for directing output light onto the test site.

It should be understood that although the image capturing device assembly 116 is described as including a body portion 140 to which the image capturing device module 142 is mounted, in an alternate embodiment, the body portion 140 may have housed therein the image capturing device module 142 and the optional light source 152, wherein the body portion 140 is configured for coupling to an exterior surface of the test probe such as illustrated in FIG. 4. The body portion 140 would further include the imaging lens 154 formed in alignment with the image capturing device module 142 and the opening 156 when the light source 152 is included. In yet another alternate embodiment, the image capturing device module 142 and an optional light source 152 may be configured for coupling to an interior surface, or housed within an interior passage of the test probe 114, such as illustrated schematically in FIG. 5.

Figure 7:
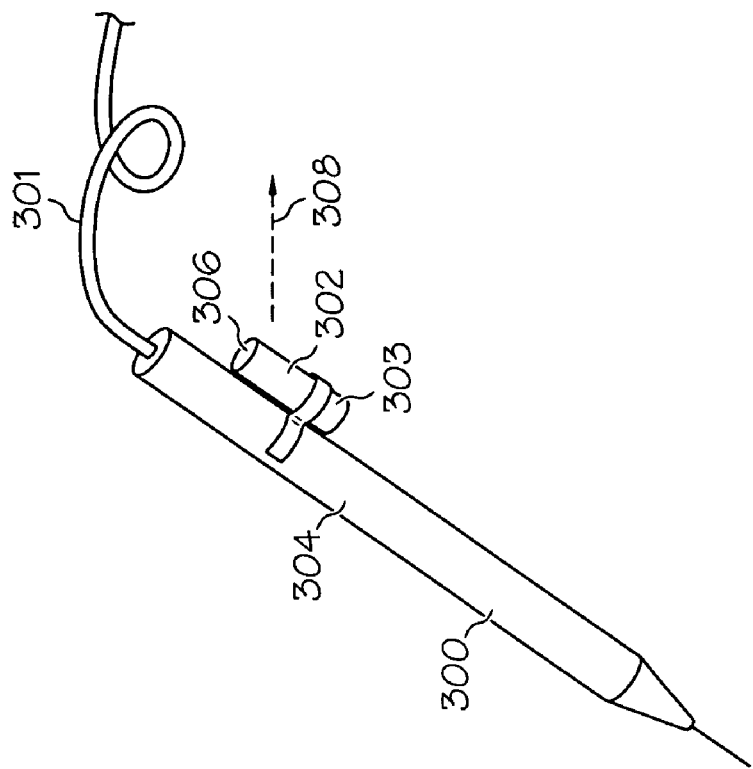
FIG. 7 is an enlarged three-dimensional view of a test probe and an image capturing device assembly according to an embodiment.
Figure 6:
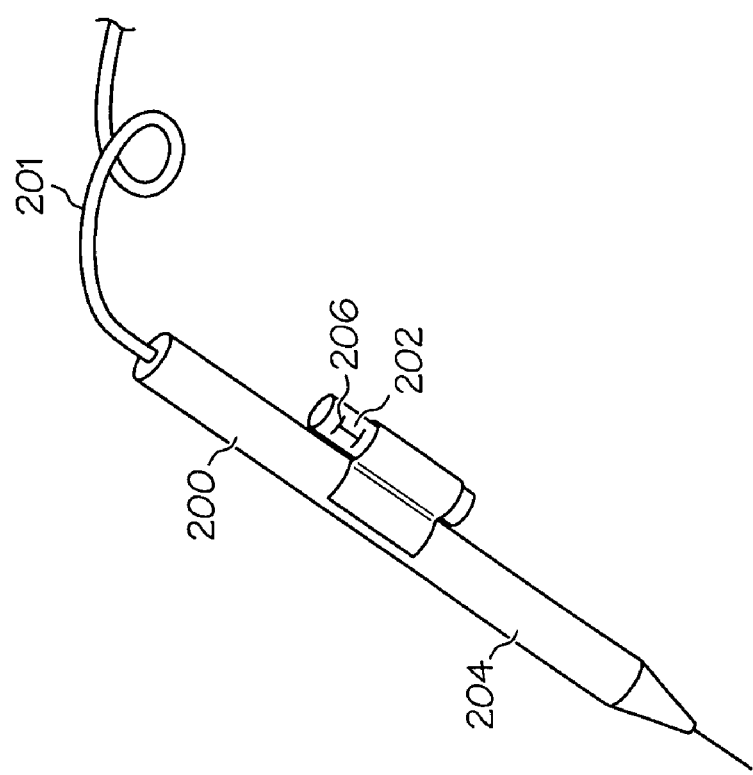
FIG. 6 is an enlarged three-dimensional view of a test probe and an image capturing device assembly according to an embodiment.

Referring now to FIGS. 6 and 7, illustrated are alternate embodiments of an image capturing device positioned relative to a test probe, such as an oscilloscope probe. As best illustrated in FIG. 6, provided is a test probe 200, generally similar to the test probe 114 of FIG. 1, coupled to an oscilloscope (not shown) via a wired link 201. An image capturing device assembly 202, generally similar to the image capturing device assembly 116 of FIG. 1 is coupled to the test probe 200 and configured to generate a digital or analog image output in a similar manner to the image capturing device assembly 116. In contrast to the first disclosed embodiment, the image capturing device assembly 202 is configured to electronically couple or attach to a body portion 204 of the test probe 200. It is anticipated that the image capturing device assembly 202 may be coupled to the test probe 200 in a clip-like, spring-like, magnetic, or similar coupling manner and may additionally include an electronic coupling to the test probe 200, such as a mating prong and receptacle type coupling, an electromagnetic coupling, or the similar type of electronic coupling so as to enable the image capturing device assembly 202 to receive power, and more particularly an input voltage via the test probe 200. In addition, the image capturing device assembly 202 is configured to deliver an output signal via the test probe 200, and more particularly, the wired link 201.

As best illustrated in FIG. 7, provided is a test probe 300, generally similar to the test probe 114 of FIG. 1, coupled to an oscilloscope (not shown) via a wired link 301. An image capturing device assembly 302, generally similar to the image capturing device assembly 116 of FIG. 1 is coupled to the test probe 300 and configured to generate a digital or analog image output in a similar manner to the image capturing device assembly 116. In contrast to the previously disclosed embodiments, the image capturing device assembly 302 is configured to include a power source within an image capturing device module 303, generally similar to image capturing device module 142 of FIG. 3. More specifically, the image capturing device assembly 302 is configured to include a power source 306 such as a battery, or the like, thereby capable of operation without receiving an input voltage via a wired link or from the test probe 300. It is anticipated that the image capturing device assembly 302 may be coupled to the test probe 300 in a clip-like, spring-like, magnetic, or similar coupling manner. In addition, the image capturing device assembly 302 is wirelessly configured (as indicated by the dashed arrow 308) to deliver via a wireless link 308 an image output signal to a computer, such as the computer 111 of FIG. 1 or video monitor. Accordingly, an operator of the testing device is easily able to couple the image capturing device assembly 302 to the test probe 300 without the inclusion of any additional wiring, wired links, or electronic coupling means.

In a preferred embodiment, the image capturing device assembly, such as the image capturing device assembly 116, 202 or 302, may further include a focus adjustment means 206 (FIG. 2) providing the operator with a means of focusing the image of the circuit being tested.

Accordingly, disclosed is an image capturing device assembly for use with a test probe in which an image of a site being tested is viewable by an operator as a magnified image on a display monitor. The image capturing device assembly is configured for attachment to a body portion of a test probe, such as an oscilloscope probe. The end result is an assembly that is easily attached to a test probe, such as those currently on the market, thus enabling the operator to view an image of the site being tested on a linked display monitor while simultaneously viewing information received on the testing device display monitor.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

I claim:

1. An image capturing device assembly for use with a test probe comprising:
    an image capturing device module configured for electronically coupling to a surface of the test probe using a mating prong for providing the image capturing device with power directly from the test probe, wherein the image capturing device module includes an image capturing device configured to generate an output video signal; and
    a display monitor coupled to the image capturing device and configured to receive the output video signal and generate a display,
    wherein the image capturing device is a charge coupled device.

2. An image capturing device assembly as claimed in claim 1, further including a body portion configured for detachably engaging with an exterior surface of the test probe, wherein the image capturing device module is coupled to the body portion.

3. An image capturing device assembly as claimed in claim 2, wherein the image capturing device module is housed within the body portion.

4. An image capturing device assembly as claimed in claim 2, wherein the body portion includes an imaging lens in alignment with the image capturing device.

5. An image capturing device assembly as claimed in claim 2, wherein the body portion includes a cut-out configured for receiving the test probe therein and thereby detachably engaging the body portion to the test probe.

6. An image capturing device assembly as claimed in claim 2, wherein the body portion includes a magnetic coupling configured for magnetically coupling the body portion to the external surface of the test probe.

7. An image capturing device assembly as claimed in claim 2, wherein the image capturing device module further includes a light source.

8. An image capturing device assembly as claimed in claim 7, wherein the body portion further includes an opening formed therein and in alignment with an output of the light source for directing light therethrough the body portion.

9. An image capturing device assembly as claimed in claim 7, wherein the light source is configured to emit light in one of an ultraviolet wavelength range or a visible wavelength range.

10. An image capturing device assembly as claimed in claim 1, wherein the display monitor is coupled to the image capturing device via one of a wired connection or a wireless connection.

11. An image capturing device assembly as claimed in claim 1, wherein the image capturing device module is configured for engaging with an interior surface of the test probe.

12. A test probe and image capturing device assembly comprising:
    a test probe including a main body having a first end and a second end and defining a passage extending between the first end and the second end, the test probe further having a probe tip defined at the second end; and
    an image capturing device assembly configured for electronically coupling to an external surface of the test probe using a mating prong for providing the image capturing device with power directly from the test probe, the image capturing device assembly comprising:
        an image capturing device configured to generate an output video signal; and
        a display monitor coupled to the image capturing device and configured to receive the output video signal and generate a display.

13. A test probe and image capturing device assembly as claimed in claim 12, wherein the image capturing device assembly further includes a body portion configured for coupling the image capturing device to the test probe, wherein the image capturing device module is coupled to the body portion.

14. A test probe and image capturing device assembly as claimed in claim 13, wherein the body portion includes an imaging lens in alignment with the image capturing device.

15. A test probe and image capturing device assembly as claimed in claim 13, wherein the body portion includes a cut-out configured for detachably engaging the test probe therein.

16. A test probe and image capturing device assembly as claimed in claim 13, wherein the body portion includes a magnetic coupling configured for magnetically coupling the image capturing device module to the external surface of the test probe.

17. A test probe and image capturing device assembly as claimed in claim 13, wherein the assembly further includes a light source configured to direct output light toward the probe tip.

18. A test probe and image capturing device assembly as claimed in claim 17, wherein the body portion includes an opening formed therein and in alignment with an output of the light source for directing light there through.

19. A system for testing circuit board assemblies comprising:
    an electronic testing device including a test probe, processing means and a display monitor configured to provide viewing of a plurality of signal voltages received by the test probe on the display monitor; and
    an image capturing device assembly configured for coupling to an external surface of the test probe and generating at least one of a digital output video signal or an analog output video signal viewable on a linked display monitor,
    the test probe comprising:
        a main body having a first end and a second end and defining a passage extending between the first end and the second end; and
        a test point at the second end for contacting a test site, the test site being an ultraviolet identifiable test site;
    the image capturing device assembly comprising:
        a body portion; and
        an image capturing device coupled to the body portion and configured to generate the digital output video signal or the analog output video signal, the display monitor receiving the digital output video signal or the analog output video signal, the image capturing device being configured to capture an image using ultraviolet light.

20. A system as claimed in claim 19, wherein the image capturing device is linked to the display monitor via one of a wired link or a wireless link.

* * * * *